US006677897B2

(12) United States Patent
Livingston

(10) Patent No.: US 6,677,897 B2
(45) Date of Patent: Jan. 13, 2004

(54) SOLID STATE TRANSMITTER CIRCUIT

(75) Inventor: Stan W. Livingston, Fullerton, CA (US)

(73) Assignee: Raytheon Company, Lexington, MA (US)

(*) Notice: Subject to any disclaimer, the term of this patent is extended or adjusted under 35 U.S.C. 154(b) by 29 days.

(21) Appl. No.: 10/062,849

(22) Filed: Jan. 31, 2002

(65) Prior Publication Data
US 2003/0142013 A1 Jul. 31, 2003

(51) Int. Cl.$^7$ ............................. H01Q 3/26; H01Q 3/22; H01P 5/18
(52) U.S. Cl. ........................ 342/368; 342/375; 333/109
(58) Field of Search ....................... 342/175, 202–204, 342/368–377, 375; 333/109

(56) References Cited

U.S. PATENT DOCUMENTS 4,764,771 A * 8/1988 Sterns ........................ 342/373
5,731,784 A * 3/1998 Barron et al. ............... 342/204
6,097,267 A * 8/2000 Hampel ...................... 333/128
6,232,920 B1   5/2001 Brookner et al.
6,396,349 B2 * 5/2002 Takei et al. ................. 330/286

OTHER PUBLICATIONS

RF Directional Couplers, Michael G. Ellis, Ph.D., Electronic Systems Products (8 pages).

* cited by examiner

Primary Examiner—Thomas H. Tarcza
Assistant Examiner—Brian Andrea
(74) Attorney, Agent, or Firm—Leonard A. Alkov; Glenn H. Lenzen, Jr.

(57) ABSTRACT

A microwave transmitter circuit including a divider series feed signal line, collector series feed signal line, a plurality of parallel solid state amplifier coupler circuits connected between the divider series feed line and the collector series feed line, and phase shifting circuitry distributed along the collector series feed line for compensating phase tracking error between the divider series feed line and the collector series feed line.

18 Claims, 2 Drawing Sheets

SOLID STATE TRANSMITTER CIRCUIT

TECHNICAL FIELD OF THE DISCLOSURE

This invention relates to active transmitter circuits for radar systems.

BACKGROUND OF THE DISCLOSURE

Radar or communications systems including an active transmitter module coupled to a passive array antenna or sub-array could benefit with an efficient feed network that enables solid state combining. Generic solid state devices have been shown to be more functional, reliable, compact, easily upgraded and lower cost compared to the maintenance of tube based systems.

However, considerations including ohmic feed losses, size and costs have discouraged replacing vacuum tube systems with high power solid state systems at microwave frequencies. In particular, high power solid state microwave systems built with poor efficiency increases solid state device counts which resulted in increased size and cost. The new technique for combining solid state devices as disclosed herein achieves cost and size competitiveness and offers improved performance compared to vacuum tube systems.

Low loss waveguide corporate combining has advantages, assuming volume is available. The drawback of the corporate waveguide feed is that for $2^N$ modules typically there need to be N levels of combining. The design for a radial combiner can be difficult in terms of impedance match, and also the orientation may not lend itself adaptable for cooling modules. A series resonant combiner, although very efficient and compact, works best only when all modules are functional and over very narrow bandwidths. A drawback for prior attempts using traveling wave feeds has been that a larger number of ports (e.g., up to 50) usually have been necessary for better efficiency. Combining solid state devices is more manageable if done in smaller subarray groups. Design, manufacturing and maintenance of solid state subarray power blocks is sometimes difficult to achieve using state of the art combining techniques.

There is accordingly a need a reliable, compact and efficient solid state amplifier microwave combiner.

SUMMARY OF THE DISCLOSURE

A solid state transmitter circuit is described that includes a divider series feed signal line, a collector series feed signal line, a plurality of parallel solid state amplifier coupler circuits connected between the divider series feed line and the collector series feed line, and phase shifting circuitry distributed along the divider series feed line for compensating phase tracking error between the divider series feed line and the collector series feed line. A further aspect is a signal injection circuit connected between an input of the divider series feed line and an input of the collector series feed line.

BRIEF DESCRIPTION OF THE DRAWING

Features and advantages of the present invention will become more apparent from the following detailed description of an exemplary embodiment thereof, as illustrated in the accompanying drawings, in which.

DETAILED DESCRIPTION OF THE DISCLOSURE

Figure 1:
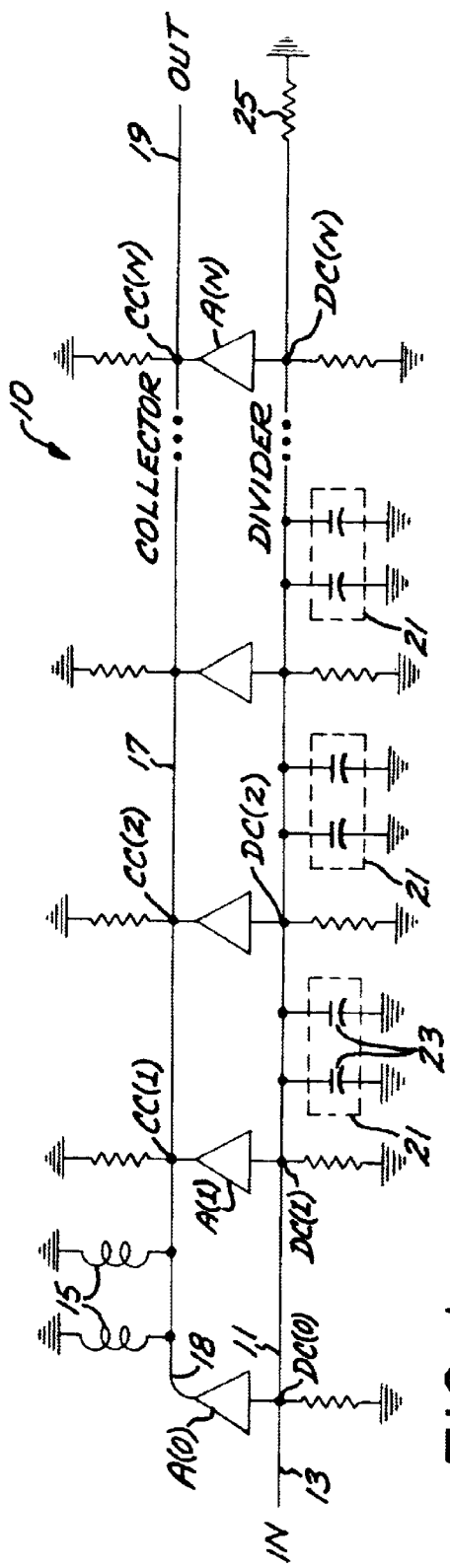
FIG. 1 is a schematic electrical diagram of a microwave combiner circuit that employs features of the invention.

FIG. 1 is a schematic electrical diagram of elements of a solid state transmitter circuit 10 that employs features of the invention. The transmitter circuit 10 includes a divider series feed signal line or path 11 that receives an RF signal at an input or start 13 which is the input to the combiner circuit. The divider series feed signal path 11 can comprise a suitable microwave transmission line such as a waveguide. Respective divider directional couplers DC(0)–DC(N) are connected to the divider series feed signal line 11 at a spacing of about one half of a selected operational wavelength, typically for waveguide transmission lines, but not necessarily, particularly for applications using other transmission media, at the center of an operating frequency band. The $0^{th}$ directional coupler DC(0) is located close to or at the input 13 of the divider feed line 11. The divider directional couplers DC(0)–DC(N) are configured to couple power from the divider feed line 11 to respective solid state RF amplifiers A(0)–A(N).

The output of $0^{th}$ RF amplifier A(0) is provided to an inductive phase-matching circuit 15 whose output is coupled to the input 18 of a collector series feed signal line or path 17 which can comprise a suitable microwave transmission line such as a waveguide.

Respective collector directional couplers CC(1)–CC(N) are connected to the collector series feed line 17 at a spacing equivalent to an electrical length of about one half the operational wavelength, and respectively receive the outputs of the solid state amplifiers A(1)–A(N). The end 19 of the collector series feed line 17 that is downstream from the input 13 of the divider series feed line 11 comprises the output of the circuit 10. The directional couplers CC(1)–CC(N) are configured to couple energy from the amplifiers A(1)–A(N) into the collector feed line 17.

Each serially connected divider directional coupler DC(I), solid state amplifier A(I), and collector directional coupler CC(I) comprises a solid state amplifier coupler circuit that is in parallel with the other coupler circuits. The couplers of each coupling amplifier arm can be considered respectively associated directional couplers. For reference, the locations on the divider and collector series feed signal lines 11, 17 at which directional couplers are connected are called ports.

The directional coupler DC(0), the solid state amplifier A(0) and the phase matching circuit 15 provides injection of a phase matched signal directly injected into the input 18 of the collector series feed signal line without the use of a coupler connected to the collector series feed line 17. This eliminates a coupler stage loss, and can allow an RF input signal having an amplitude that can be supported by a relatively small number of collector directional couplers CC(0)–CC(N). In prior systems, series feeds have not often been used for small arrays having less than less than about 20 ports, for example, since for greater efficiency the amplitude of the signal injected into the collector series feed line usually needed to be greater than that which can be supported by the couplers when the number ports becomes small. For small arrays, this direct phase method signal injection technique may not introduce a signal with the exact amplitude for perfect efficiency, but it is an improvement compared to just using a coupler at the start of the collector series feed signal line.

For substantially uniform amplitude weighting within the circuit 10, the directional couplers at each of the divider and collector series feed signal lines 11, 17 will typically have unique coupling values. The maximum allowable coupling value in the divider feed line 11 is at the combiner output end 19, so as to provide a uniform output since power is successively extracted along the divider feed line 11. In contrast, coupling values for the collector feed line 17 should be strongest at the input end 13 and weaker near the output end 19. As a result of the variation in coupling values from weak to strong for the divider feed line 11 and from strong to weak for the collector feed line 17, corresponding directional couplers will have different coupling values.

Because the output power of the solid state amplifiers is limited, the coupling of energy from the collector feed line 17 should be as efficient as practicable. High efficiency is realized by using the strongest coupling values possible in the collector feed line 17. With coupling values uniquely defined to provide a uniform distribution, the phase insertion in the collector series feed line becomes different and unique compared to the divider series feed line through each of the ports.

Thus, the respectively associated divider and collector couplers DC(I) and CC(I) of each of the parallel coupler arms will have different coupling values to provide a uniform or substantially uniform distribution, with coupling levels running in opposite order from weak to strong for the divider and strong to weak for the collector. This causes phase tracking error between the divider series feed line 17 and the collector series feed line 11, wherein the phase velocity in the divider and collector series feed lines 11, 17 do not track from port to port. In other words, the differing coupling at respectively associated ports of the divider and collector feed lines 11, 17 perturbs the respective phase velocities in the divider and collector feed lines 11, 17. If the phase tracking error is not corrected or compensated, the collected signals in the collector series feed line 17 will not be phase coherent, which introduces inefficiency.

Figure 2:
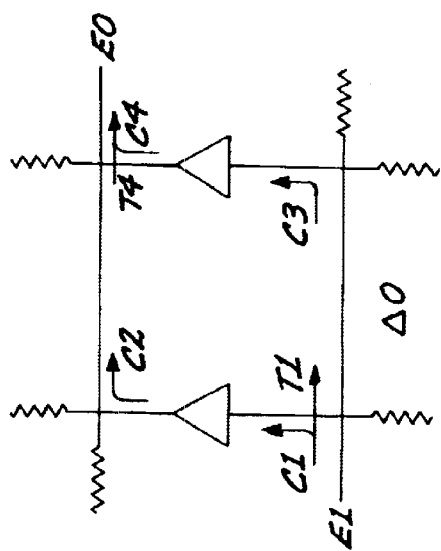
FIG. 2 is a simplified combiner circuit for illustrating needed phase compensation.

The inefficiency is illustrated with respect to the circuit schematic of FIG. 2, which shows a simplified series combiner circuit with two stages, with input signal E1 and output signal E0. Thus, $$E0=E1[C1*C2*T4+T1*C3*C4]$$

Ideally for maximum E0, $$\Theta C1+\Theta C2+\Theta T4=\Theta T1+\Theta C3+\Theta C4$$

where $\Theta Cx$ represents the coupling insertion phase at coupler x, and $\Theta T1$ represents the transmission insertion phase through coupler x.

Typically, however, $\Theta C1$ is on the order of $\Theta C3$, and $\Theta C2$ is on the order of $\Theta C4$, while $\Theta T1$ does not equal $\Theta T4$. Accordingly, phase compensation is needed in one of the arms:

$$\Delta\Theta\approx\Theta T4-\Theta T1.$$

Phase compensation can be added in the network to track the two feeds, i.e. the divider and collector series feed lines 11, 17. Preferably, for high power handling, phase compensation circuitry should not be implemented in the collector feed line because of the risk of power breakdown. Capacitive phase shifts can be applied in the divider feed line if the coupling values are weaker compared to the corresponding port of the collector feed line at each of the locations of the divider couplers DC(1)–DC(N) so as to match the divider's phase insertion. The divider feed line uses weaker coupling values than the corresponding collector coupling values for all ports; thus the dispersion can arbitrarily be increased and equalized by pairs 21 of shunt capacitors 23 placed in series to match the reactance of the collector line ports. In an exemplary embodiment, the capacitors 23 of each pair 21 are spaced apart by electrical lengths equivalent to one quarter of the operating wavelength, and pairs 21 are respectively connected between adjacent ones of the divider directional couplers DC(1)–DC(N) and between the directional divider coupler DC(N) and the termination load 25 of the divider series feed signal line 11. A pair 21 of capacitors 23 spaced by an electrical length equivalent to a quarter-wave wavelength in this exemplary embodiment yields a matched phase shifter with small incremental phase shifts proportional to the capacitance. Weaker coupling in the divider feed line 11 is possible because it need not be necessarily efficient; power not coupled to the solid state inputs just becomes dissipated in the end load 25. The RF input drive signal to the divider feed line can readily be increased to compensate low divider line efficiency.

Phase error capacitively compensated in the divider series feed line is a technique that realizes coherent phase at each port without sacrificing powering handling. Other phase tracking approaches include the use of phase shifters in the solid state amplifiers in the parallel coupler circuits. Other parallel approaches, although workable, may be undesirable from the standpoint that the phase error compensation required would be the total sum of the incremental phase error at each of the series ports up to the particular Nth port. Since the total sum ranges from +/−360 degrees, the parallel phase tracking approach is less advantageous to the series phase compensation of FIG. 1, which in one exemplary embodiment typically employs no more than 30 degrees of phase correction at any given location. Small incremental phase compensation in series maximizes efficiency and is less complex compared to using phase shifters in the parallel coupler circuits.

Generally, using the technique of FIG. 1, phase is tuned by capacitive phase reactance in the low power divider series feed line so as to match the dispersion of the collector series feed line. A tolerance analysis of the exemplary waveguide implementation of the combiner circuit of FIG. 1, as for example depicted in FIGS. 3–5, indicates that, for some applications, the disclosed series phase trimming can be incorporated into a divider feed line and maintained during manufacturing without the need to retune from unit to unit.

Figure 3:
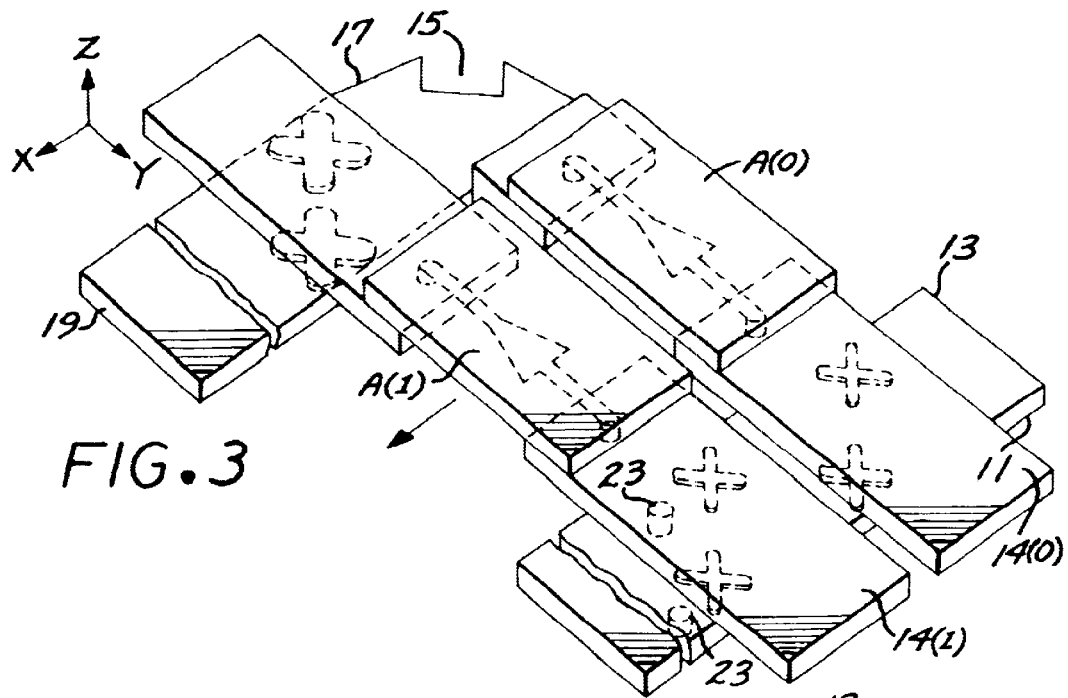
FIG. 3 is a diagrammatic isometric view of an exemplary waveguide implementation of the microwave combiner circuit of FIG. 1.
Figure 4:
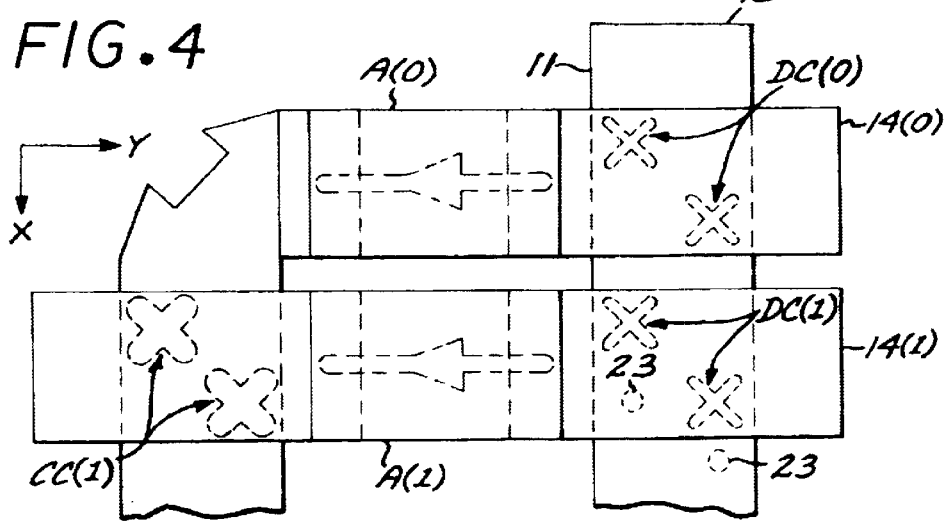
FIG. 4 is a schematic top plan view of the waveguide implementation of the microwave combiner circuit of FIG. 3.
Figure 5:
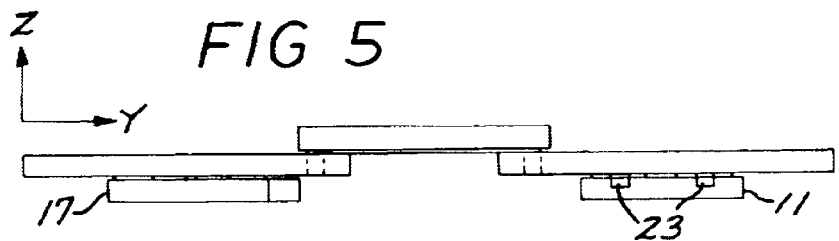
FIG. 5 is a cross-sectional elevational view depicting an amplifier coupler circuit of the waveguide structure of FIG. 3.

FIGS. 3–5 schematically illustrate a waveguide circuit implementation of the solid state transmitter circuit of FIG. 1. The waveguide circuit implementation in this exemplary embodiment employs a series waveguide feed structure with a compact lattice spacing. The waveguide circuit 50 includes a main divider waveguide 11 that receives a RF signal at an input 13 thereof. Respective directional waveguide couplers DC(0)–DC(N) are coupled between the main divider waveguide 11 and respective coupler divider waveguides 14(0)–14(N) at a spacing equal to an electrical distance of about one half of a selected operational wavelength. The $0^{th}$ directional waveguide coupler DC(0) is located close to or at the input 13 of the divider feed line 11. The directional waveguide couplers DC(0)–DC(N) are configured to couple power from the divider waveguide 11 through the respective coupler divider waveguides 14(0)–14(N) to respective solid state RF amplifier modules A(0)–A(N) through waveguide transitions for this exemplary embodiment.

The output of $0^{th}$ RF amplifier module A(0) is provided to an inductive phase-matching iris block 15 whose output is coupled to the start end of a collector waveguide 17. Respective directional waveguide couplers CC(1)–CC(N) couple respective coupler combiner waveguides 16(1)–16(N) to the collector waveguide 17 at a spacing of an electrical distance equivalent to about one half the operational wavelength, and respectively receive the outputs of the solid state amplifiers modules A(1)–A(N). The end 19 of the collector waveguide 17 that is downstream from the input 13 of the divider waveguide 11 comprises the output of the series combiner circuit. The directional waveguide couplers CC(1)–CC(N) are configured to couple energy from the amplifier modules A(1)–A(N) into the collector waveguide 17.

Capacitive posts 23 are inserted in the divider waveguide 11 for phase matching the collector waveguide 17 in accordance with the above discussion of phase matching the feed lines 11, 17 of the combiner circuit of FIG. 1. In an exemplary embodiment, the posts 23 are one half the height of the waveguide.

A series waveguide feed implementation of the invention has a compact and competitive lattice spacing that compliments RF solid state module size and packaging. A traveling wave series feed can be designed with 4 port couplers at each solid state output so that graceful degradation and gain control over large dynamic ranges can be achieved reliably. An advantage of the traveling wave feed is that interaction of the individual solid state module becomes transparent, thus upgrading, replacing or even turning off modules can easily and reliably be done without the need for design upgrades or tight s-parameter tolerances on the solid state devices. Novel delay technique between a series divider feed (to excite the RF amplifiers) and a series collector feed (to re-sum the power) yields high efficiency without frequency dispersion. Novel signal injection and phase matching techniques maintain the efficiency in the traveling wave series feed better than –0.25 dB over a 20% bandwidth. These disclosed techniques allow small series groups (<20) to be combined efficiently and compactly. This allows smaller subarray blocks to be built that are less sensitive to manufacturing tolerances and easier to replace in the field. Smaller subarray building blocks give more flexibility to systems that may wish to add or replace combiners as needed.

The disclosed signal injection technique introduces a phase-matched signal at the start of the collector series feed, to enhance active efficiency of the couplers downstream. The couplers can be realized in waveguide as just one example of implementation, and an inductive iris can be employed in the bend for the injection phase match in a waveguide implementation. Alternatively, the signal injection technique can be implemented using other types of couplers and transmission line, e.g., using coaxial lines and coaxial couplers instead of waveguide. Using waveguide as the final combining stage provides low loss, thus further improving efficiency competitiveness. In addition, waveguide offers a proven safety factor for corona discharge.

The disclosed features enable a relatively short travelling wave combiner to have an efficiency that is comparable to that of much longer combiners, and provide for high combining efficiency and ease of phase compensation tuning adjustment in travelling combiner designs.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A microwave solid state transmitter circuit comprising:
    a divider series feed signal line;
    a collector series feed signal line;
    a plurality of solid state amplifier coupler circuits connected between said divider feed signal line and said collector feed signal line, each solid state amplifier coupler circuit coupling into said collector feed signal line an amplified version of a signal coupled from said divider feed signal line; and
    phase shifting circuitry distributed along said divider feed signal line for compensating phase tracking error between said divider feed signal line and said collector feed signal line.

2. The circuit of claim 1 wherein said phase shifting circuitry includes shunt capacitors.

3. A microwave solid state transmitter circuit comprising:
    a divider series feed signal line;
    a collector series feed signal line;
    a plurality of solid state amplifier coupler circuits connected between said divider feed signal line and said collector feed signal line, each solid state amplifier coupler circuit coupling into said collector feed signal line an amplified version of a signal coupled from said divider feed signal line; and
    phase shifting circuitry distributed along said divider feed signal line for compensating phase tracking error between said divider feed signal line and said collector feed signal line;
    wherein said phase shifting circuitry includes shunt capacitors; and
    wherein said phase shifting circuitry includes pairs of shunt capacitors, wherein capacitors of each pair are separated by an electrical length equivalent to a quarter wavelength of an operational wavelength.

4. The circuit of claim 2 wherein said divider series feed signal line comprises a divider series feed waveguide and wherein said shunt capacitors comprise posts in said waveguide.

5. A microwave solid state transmitter circuit comprising:
    a divider series feed signal line;
    a collector series feed signal line;
    a plurality of solid state amplifier coupler circuits connected between said divider feed signal line and said collector feed signal line, each solid state amplifier coupler circuit coupleing into said collector feed signal line an amplified version of a signal coupled from said divider feed signal line; and
    phase shifting circuitry distributed along said divider feed signal line for compensating phase tracking error between said divider feed signal line and said collector feed signal line;
    further including a signal injection circuit connected between an input of said divider series feed line and an input of said collector series feed line.

6. The circuit of claim 5 wherein said signal injection circuit includes a directional coupler, a solid state amplifier, and an inductive phase shifting circuit.

7. The circuit of claim 6 wherein said collector series feed signal line comprises a collector series feed waveguide and wherein said inductive phase shifting circuit comprises an iris block.

8. A microwave solid state transmitter circuit comprising:
- a divider series feed waveguide;
- a collector series feed waveguide;
- a plurality of solid state amplifier coupler circuits connected between said divider series feed waveguide and said collector series feed waveguide, each solid state amplifier coupler circuit coupling into said collector series feed waveguide an amplified version of a signal coupled from said divider series feed waveguide;
- each sold state amplifier coupler circuit comprising a first directional coupler connected to said divider series feed waveguide, a second directional coupler connected to said collector series feed waveguide, and a solid state amplifier connected between said first directional coupler and said second directional coupler; and
- phase shifting circuitry distributed along said collector series feed waveguide for compensating phase tracking error between said divider series feed waveguide and said collector series feed waveguide.

9. The circuit of claim 8 wherein said phase shifting circuitry includes shunt capacitors.

10. A microwave solid state transmitter circuit comprising:
- a divider series waveguide;
- a collector series feed waveguide;
- a plurality of solid state amplifier coupler circuits connected between said divider series waveguide and collector series feed waveguide, each solid state amplifier coupler circuit coupling into said collector feed waveguide an amplified version of a signal coupled from said divider series feed waveguide;
- each solid state amplifier coupler circuit comprising a first directional coupler connected to said divider series feed waveguide, a second directional coupler connected to said collector series feed waveguide, and a solid state amplifier connected between said first directional coupler and said second directional coupler; and
- phase shifting circuitry distributed along said collector series feed waveguide for compensating phase tracking error between said divider series feed waveguide and said collector series feed waveguide;
- wherein said phase shifting circuitry includes shunt capacitors; and
- wherein said phase shifting circuitry includes pairs of shunt capacitors, wherein capacitors of each pair are separated by a quarter wavelength.

11. The circuit of claim 9 wherein said shunt capacitors comprise posts in said divider waveguide.

12. A microwave solid state transmitter circuit comprising:
- a divider series waveguide;
- a collector series feed waveguide;
- a plurality of solid state amplifier coupler circuits connected between said divider series waveguide and collector series feed waveguide, each solid state amplifier coupler circuit coupling into said collector feed waveguide an amplified version of a signal coupled from said divider series feed waveguide;
- each solid state amplifier coupler circuit comprising a first directional coupler connected to said divider series feed waveguide, a second directional coupler connected to said collector series feed waveguide, and a solid state amplifier connected between said first directional coupler and said second directional coupler; and
- phase shifting circuitry distributed along said collector series feed waveguide for compensating phase tracking error between said divider series feed waveguide and said collector series feed waveguide;
- further including a signal injection circuit connected between an input of said divider series feed waveguide and an input of said collector series feed waveguide.

13. The circuit of claim 12 wherein said signal injection circuit includes a directional coupler, a solid state amplifier, and an inductive phase shifting circuit.

14. The circuit of claim 13 wherein said inductive phase shifting circuit comprises an iris block.

15. A microwave combiner circuit comprising:
- a divider series feed signal line;
- a collector series feed signal line;
- a signal injection circuit connected between an input of said divider series feed signal line and an input of said collector series feed signal line; and
- a plurality of solid state amplifier coupler circuits connected between said divider feed signal line and said collector feed signal line, each solid state amplifier coupler circuit coupling into said collector feed signal line an amplified version of a signal coupled from said divider feed signal line.

16. The circuit of claim 15 wherein said signal injection circuit includes a directional coupler, a solid state amplifier, and an inductive phase shifting circuit.

17. The circuit of claim 16 wherein said collector series feed signal line comprises a collector series feed waveguide and said inductive phase shifting circuit comprises an iris block.

18. The circuit of claim 15 further including phase compensating circuitry connected to said divider series feed signal line.

* * * * *